July 31, 1956 T. O. STANLEY 2,757,287

STABILIZED SEMI-CONDUCTOR OSCILLATOR CIRCUIT

Filed July 17, 1953

INVENTOR.
Thomas O. Stanley

BY H. L. Newton
ATTORNEY

United States Patent Office 2,757,287

Patented July 31, 1956

2,757,287

STABILIZED SEMI-CONDUCTOR OSCILLATOR CIRCUIT

Thomas O. Stanley, Princeton, N. J., assignor to Radio Corporation of America, a corporation of Delaware Application July 17, 1953, Serial No. 368,784

13 Claims. (Cl. 250—36)

This invention relates in general to electrical oscillator or oscillation generator circuits and in particular to circuits of that type utilizing semi-conductor devices.

The recent development of commercially useful semi-conductor devices of the type employing a semi-conductive element having three contacting electrodes has already had a decided effect upon and has caused the introduction of many new techniques in the electronic signal communication field. These devices, known extensively as "transistors," are small in size, especially when compared with the ordinary vacuum tube, require no heater power, are very durable, and consist of materials which appear to have a long useful life.

Transistors normally are of two general classes which are known as the point-contact transistor and the junction transistor. Point-contact transistors comprise, in general, a body of semi-conductive material and three contacting electrodes which have been designated as the emitter electrode, the collector electrode, and the base electrode. The semi-conductive body may be either of the N or P type. If the body is of the N type, the emitter electrode is normally biased positively to be in a relatively conducting or forward direction and the collector electrode negatively to be in a relatively non-conducting or reverse direction, each with respect to the base electrode. If the body is of the P type, the potentials are reversed.

The junction transistor, on the other hand, comprises, in general, a body of semi-conductive material having two zones of one conductivity type separated by a zone of the opposite conductivity type. Thus, the device may be of either the N-P-N or P-N-P type. If the transistor is of the N-P-N type, the emitter electrode is generally connected to the negative terminal of the source of potential and the collector electrode to a positive source of potential, each with respect to the base electrode. For the P-N-P type these polarities are reversed.

Transistor oscillator circuits employing transistors of both the point-contact and junction type have been developed and are presently well known in the art. These circuits may be connected to operate in any of a number of ways depending primarily on the particular application for which the circuit was designed. Thus, oscillator circuits have been developed using an external feedback path between the input and output circuits of the transistor. If the energy which is fed back is of proper phase and amplitude, as is well known and understood, the normal circuit losses may be compensated for and sustained oscillation will be accomplished. In other oscillator circuits utilizing transistors, a feedback path has been found to be unnecessary; sustained oscillation being accomplished by virtue of the particular electrical characteristics of the transistor used.

In many of the prior art transistor oscillator circuits, particularly of the type utilizing an external feedback circuit, it has been found difficult to maintain the amplitude of the oscillations substantially constant over a useful tunable range of oscillator frequencies. This deficiency has been particularly noticeable at higher frequencies. Thus, as the oscillator frequency is increased, the amplitude of the oscillations has been found to decrease. In other cases, particularly at low frequencies, the amplitude of the oscillations may be too large.

It is, accordingly, a principal object of the present invention to provide an improved semi-conductor oscillator circuit wherein the amplitude of oscillations is maintained substantially constant over a full wide range of operating frequencies.

It is another object of the present invention to provide an improved semi-conductor oscillation generator having an external feedback circuit wherein the oscillatory signal is substantially constant in amplitude with changes in frequency.

Many transistor oscillator circuits have also been characterized to some extent by frequency instability. It has been found, for example, that the fundamental operating frequency of a transistor oscillator may vary with time for a single setting of the circuit components. These variations in the fundamental frequency may be the result of variations in the source of operating bias potential and also due in large measure to temperature variations. Temperature variations may be either ambient or due to heat dissipated by the circuit elements. For most circuit applications, frequency instability of the oscillator is undesirable.

It is, accordingly, still another object of the present invention to provide an improved semi-conductor oscillator circuit which is stable in frequency of operation.

It is yet another object of the present invention to provide an improved transistor oscillation generator having an external feedback circuit wherein the fundamental operating frequency is stabilized for changes in the operating bias potential applied.

These and further objects of the present invention are achieved by providing a semi-conductor device having a frequency determining circuit with a regenerative feedback path connected between the output and input circuits. A capacitor is connected in series between the emitter and a source of fixed potential. The reactance of the capacitor is chosen so that the emitter circuit impedance decreases with increases in frequency, thus enhancing oscillation at the higher operating frequencies. Amplitude stabilization at the lower operating frequencies and frequency stability is provided by a resistor connected with the collector of the device.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figures 1, 2:
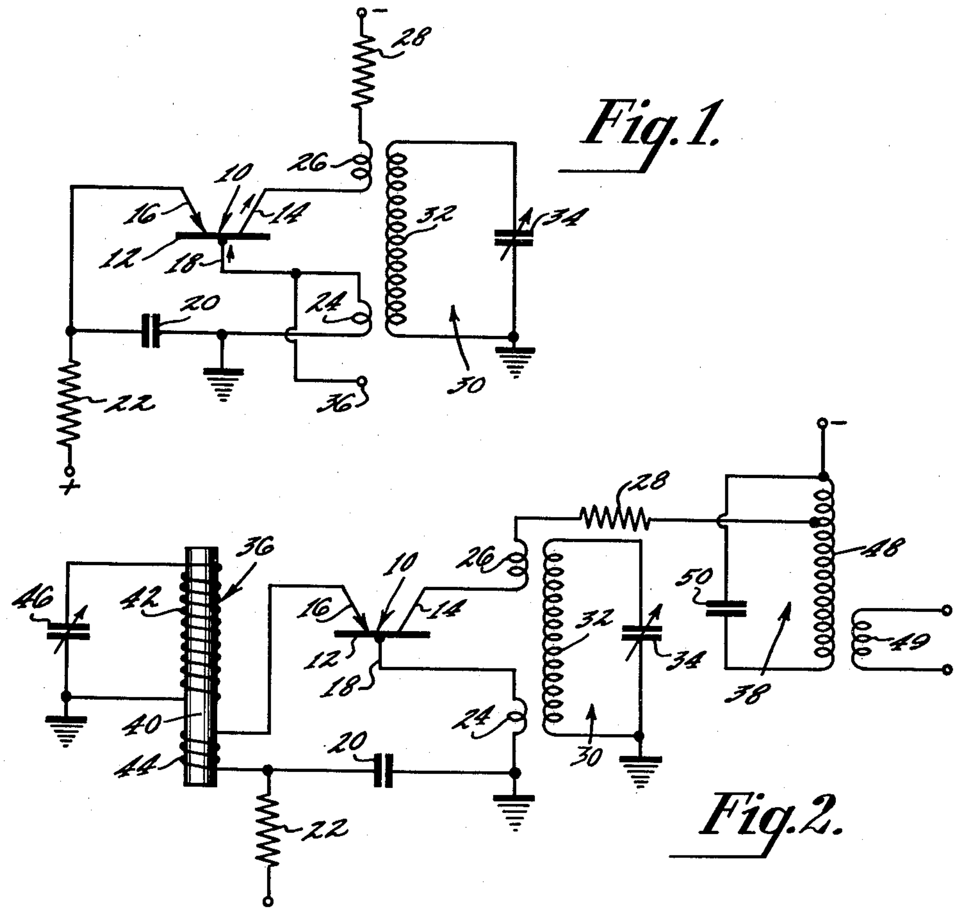
Figure 1 is a schematic circuit diagram of a transistor oscillator circuit embodying the present invention.
Figure 2 is a schematic circuit diagram of a frequency converter system embodying the oscillator circuit of Figure 1 in accordance with the present invention.

Referring now to the drawing wherein like reference numerals indicate like elements throughout the figures, and referring particularly to Figure 1, a transistor 10 has a semi-conductive body 12 and three contacting electrodes comprising an emitter electrode 16, a collector electrode 14, and a base electrode 18 in contacting engagement with the body 12. The transistor may be either a point-contact transistor of the N or P type, or it may alternatively be a junction transistor of either the N-P-N or P-N-P type. In the drawing, the transistor 10 has been illustrated as being, by way of example, of the N point-contact type.

To properly bias the transistor 10, the collector 14 is connected through an inductive winding 26 and a resistor 28 to the negative terminal of a source of biasing potential which may be a battery, the positive terminal of which may be grounded. It should be understood that any source of uni-directional current, such as rectified alternating current may be used for biasing purposes. The emitter 16 of the transistor 10 is likewise connected through a resistor 22 to a positive biasing potential supply terminal which may be that of a suitable battery, the negative terminal of which may be grounded. The resistor 22 controls the emitter bias potential for the proper starting of oscillations and the desired amplitude of oscillations. By making the emitter positive with respect to the base, as is well known and understood, it will be biased in a relatively conducting or forward direction with respect to the base. The collector, on the other hand, will be biased to be in a relatively non-conducting or reverse direction with respect to the base.

Proper feedback for sustained oscillation is established by an inductive winding 26, which is connected with the collector 14, and a further inductive winding 24 which is connected with the base 18. The windings 26 and 24 are arranged to be in a tightly-coupled inductive relationship, the mutual inductance therebetween transferring a portion of the oscillatory energy in the collector winding 26 to the base winding 24. The currents which are fed back are regenerative or in phase with the input currents flowing in the base circuit of the transistor 10.

A further regenerative feedback path is established by placing an inductor 32 of a relatively greater number of turns in a closely coupled inductive relationship to the collector and base windings 26 and 24 as indicated. The inductor 32 is part of a frequency determining or tank circuit 30, which also includes a variable tuning capacitor 34.

By arranging the tank circuit 30 as shown, the base winding is affected as if an impedance had been added in series with it. This apparent impedance can be considered as being reflected from the tank circuit into the base circuit. The reflected impedance may be increased by increasing the number of turns of the base winding. Since the related impedance will also increase with increases in the oscillator frequency and the feedback currents which flow in the base circuit are regenerative, the amplitude of the oscillations at the higher frequencies will be increased. Thus, the feedback arrangement comprising the tank circuit 30 and the collector and base windings 26, 24 is an appreciable aid in maintaining amplitude stability at the higher operating frequencies.

Additional means are provided in the emitter circuit to insure the desired amplitude stability at the higher frequencies. In accordance with this feature of the invention, a capacitor 20 is connected in series between the emitter 16 and a source of reference or ground potential. The reactance of this capacitor is chosen to be relatively large and is preferably approximately equal to the inherent resistance of the emitter circuit. Since capacitive reactance decreases with increases in frequency, any increase in the oscillator frequency will decrease the total emitter circuit impedance. Since the feedback current in the emitter circuit is degenerative, decreasing the emitter circuit impedance will increase the amplitude of oscillations at the higher frequencies. Thus, the capacitor 20 serves as a means for stabilizing the amplitude of the oscillations over the range of oscillator frequencies.

In accordance with another feature of the invention, the resistor 28 which is connected in series with the collector 26 serves a dual purpose. In one aspect, this resistor provides amplitude stabilization at the lower operating frequencies. In this respect, increases in the amplitude of oscillation will increase the current flowing in the collector circuit. The increased voltage drop across resistor 28 due to these increases in current tends to make the collector more positive and reduces the reverse bias between that electrode and the base. This decrease in the collector bias tends to decrease the amplitude of oscillations. Consequently, provision is made, in accordance with the invention, to both increase and decrease the amplitude of oscillations and achieve amplitude stability over the tunable range of oscillator frequencies.

It has also been observed that the inclusion of the resistor 28 in the collector circuit minimizes oscillator frequency variations with changes in the emitter supply bias voltage. The collector electrode characteristic of a transistor, as is well known, exhibits in part, a capacitive effect, which effect is a function of emitter bias. The capacitor representative of this capacitive effect is effectively in series with the series combination of the inductor 26 and the resistor 28 and ground. Because of the relationship established by the inclusion of a resistor 28 in the collector circuit, the capacitive susceptance which is reflected back into the resonant circuit 30 is reduced, being the equivalent susceptance of resistor 28 in series with this capacitor. Since variations of the reflected capacitance appearing in the tank circuit will also vary the oscillator frequency, and the resistor 28 reduces this capacitance, variations in frequency with emitter bias changes will be minimized. It has also been found that the inclusion of the emitter resistor 22 and the collector resistor 28 aids in suppressing low frequency relaxation oscillations.

In operation, the necessary feedback from the output circuit to the input circuit of the oscillator for sustained oscillation is obtained in part by the mutual inductive coupling between the collector winding 26 and the base winding 24. Since the current in the base winding relative to the current in the collector winding is inversely proportional to the turns ratio of the respective windings, the increase of the collector turns relative to the base turns will increase the amount of current which is fed back. This feedback is augmented by the coupling between the inductor 32 of the tank circuit 30 and the base and collector windings 24 and 26. The circuit will oscillate at a frequency approximately equal to the resonant frequency of the tank circuit 30. Output oscillations may be obtained from any convenient place in the circuit such as the terminal 36 which is connected to a point between the base 18 and the base winding 24.

Referring now to Figure 2, a frequency converter embodying an oscillator of the type illustrated in Figure 1 may comprise a loop antenna 36, the transistor 10, a parallel-resonant frequency-determining circuit 30, and a parallel-resonant circuit 38 which is tuned to the intermediate frequency. The loop antenna 36 may comprise a ferrite rod 40 with an input winding 42 and a coupling winding 44 thereon. To tune the antenna to the desired incoming signal, a variable capacitor 46 is connected in parallel with the winding 42. One end of the coupling winding 44 is connected directly to the emitter 16, and the other end is connected through the emitter resistor 22 to a source of positive biasing potential, and through the amplitude compensating capacitor 20 to ground.

It is apparent that the oscillator circuit is identical with the one illustrated in Figure 1, and operates in substantially the same manner. In this embodiment of the invention, however, the collector 14 is connected through the winding 26 and the compensating resistor 28 to a tap on an inductor 48. The inductor 48 is connected in parallel with a capacitor 50 to form a parallel resonant circuit 38 which may be tuned to the desired intermediate frequency signals.

In operation, a modulated carrier wave is received by the antenna 36 and coupled through the winding 44 and impressed between the emitter 16 and ground. The feedback oscillatory signal also appears at the emitter 16 and the two signals are mixed. This is due to the fact that the emitter voltage-collector current relationship is non-linear in transistor 10.

Accordingly, waves having a frequency corresponding to the sum and the difference of the carrier wave frequency and of the oscillatory wave frequency are amplified and developed at the collector 14. The amplified waves will have an amplitude essentially proportional to the amplitude of the impressed carrier wave. The resonant circuit 38 is tuned to either the sum or to the difference frequency which is the desired intermediate frequency. The intermediate frequency signal may be derived through a coupling winding 49 which is inductively coupled to the inductor 48 of the resonant circuit 38. It is to be understood that the intermediate frequency to which resonant circuit 38 is tuned should be outside of the range to which the oscillator tank circuit may be tuned so that the impedance of circuit 38 will always be higher for the oscillatory wave.

Referring to the oscillator circuit of Figure 3, which is substantially identical with that illustrated in Figure 1, its embodiment in a heterodyne converter will now be described. The converter includes the transistor 10, the oscillator tank circuit 30, the loop antenna 36, a transistor mixer 52, and the intermediate frequency parallel resonant circuit 38. To obtain proper biasing for mixing action, the base 60 of the transistor mixer 52 is connected through the coupling winding 44 of the loop antenna and a resistor 62 to the negative terminal of a source of biasing voltage, such as a battery. The collector electrode 58 of the transistor 52 is connected through part of the tank circuit inductor 48 to the negative terminal of a battery, the positive terminal of which may be grounded. In this manner, the emitter 56 will be biased in a conducting direction and the collector 58 will be biased in a relatively non-conducting or reverse direction each with respect to the base 60, such that mixing will take place over the non-linear portion of the emitter voltage-collector current curve.

Figure 3:
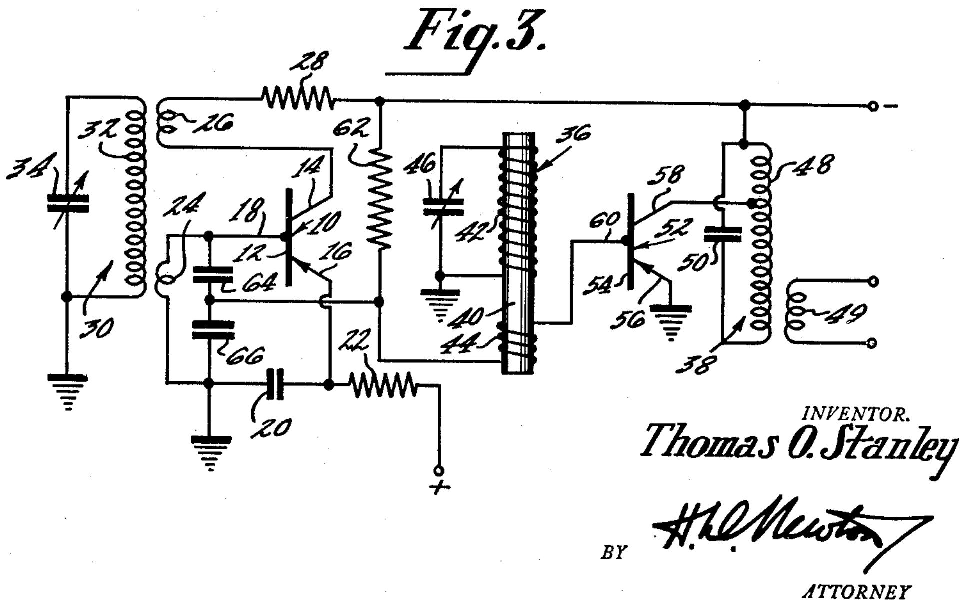
Figure 3 is a schematic circuit diagram of a further frequency converter also embodying the oscillator circuit of Figure 1 in accordance with the present invention.

As mentioned above, the oscillator circuit for the embodiment of the invention illustrated in Figure 3 is essentially the same as the one illustrated in Figure 1. In Figure 3, however, the output oscillations are taken from the junction of two equal capacitors 64 and 66 which form a voltage dividing network in parallel with the base winding 24. In operation, the output oscillatory signals are fed through the coupling winding 44 of the loop antenna 36 and applied to the transistor 52 between the base 60 and the emitter 56. The impressed modulated carrier or input signal is received by the antenna 36. This signal is then inductively coupled to the winding 44 and impressed in series between the base 60 of the transistor mixer 52 and the junction of the capacitors 64 and 66. Accordingly, the input signal and the oscillator signal are impressed in series on the base 60 and mixed by the transistor 52. An amplified signal is accordingly developed at the collector 58. The resulting signals will have a frequency corresponding to the sum and the difference of the input signal frequency and the oscillator signal frequency, and an amplitude essentially proportional to the amplitude of the input signal. The intermediate frequency resonant circuit 38, as before, may be tuned either to the sum or to the difference frequency which is the intermediate frequency. The thus obtained intermediate frequency signals may be coupled through the winding 49 to one or more intermediate frequency amplifying stages.

Circuits have been built and tested in accordance with the teachings of the present invention. In one such circuit of the type illustrated in Figure 3, in which the emitter biasing battery has a voltage rating of 1½ volts and the collector biasing battery had a voltage rating of 6 volts, the inductor 32 in the tank circuit contained 50 turns, the winding 36 had 10 turns, and the winding 24 had 5 turns. While it will be understood that the circuit specifications may vary according to the design for any particular application, the following circuit specifications are included by way of example only.

Capacitors 20, 64 and 66:

.005, .0015 and .0015 microfarads, respectively

Resistors 22, 28 and 62:

1,000, 390 and 220,000 ohms, respectively

As herein described, the amplitude of oscillations in a transistor oscillator circuit are substantially constant over the tunable range of frequencies. In addition, the frequency response of the oscillator is relatively insensitive to changes in the bias potentials applied.

What is claimed is:

1. In combination with a semi-conductor device having a semi-conductive body and an emitter, a base, and a collector electrode each in contact with said body, means for biasing said electrodes, means coupled between said collector and base electrodes providing regenerative feedback for said device to sustain oscillation thereof over a range of frequencies, means varying the bias of said collector electrode with changes in current including an impedance element coupled with said collector electrode, and means for decreasing the impedance of the emitter electrode with increases in frequency including a capacitor connected between the emitter electrode and ground for the system, said capacitor having reactance substantially equal to the resistance of the emitter electrode.

2. An oscillator for generating oscillations of substantially constant amplitude over a range of oscillator frequencies comprising in combination, a semi-conductor device having a semi-conductive body and an emitter, a base and a collector electrode each in contact with said body; means including a source of biasing potentials for biasing said electrodes; feedback means including a first inductor in circuit with said collector electrode, a second inductor in circuit with said base electrode, and a tunable frequency determining circuit inductively coupled with said first and second inductors; means varying the bias of said collector electrode with changes in current including an impedance element connected in circuit with said collector electrode; and means varying the impedance of said emitter electrode with frequency variations including a reactive element connected in circuit with said emitter electrode; said impedance and reactive elements providing amplitude stabilization for said oscillator over the range of oscillator frequencies.

3. An oscillator for generating oscillations of substantially constant amplitude over a range of oscillator frequencies comprising in combination, a semi-conductor device having a semi-conductive body and an emitter, a base and a collector electrode each in contact with said body; means including a source of biasing potentials for biasing said electrodes; feedback means including a first inductive winding in series with said collector electrode, a second inductive winding in series with said base electrode, and a tunable frequency determining circuit inductively coupled with said first and second inductive windings; a resistor connected in series with said first inductive winding; and a reactive element connected in circuit with said emitter electrode; said resistor and reactive element providing amplitude stabilization for said oscillator over the range of operating frequencies.

4. An oscillator in accordance with claim 3, wherein the reactance of said reactive element is substantially equal to the resistance of said emitter electrode.

5. In combination with a semi-conductor device having a semi-conductive body and an emitter, a base, and a collector electrode each in contact with said body, of means for biasing said electrodes, signal coupling means coupled between said collector and base electrodes providing regenerative feedback for said device for sustained oscillation thereof over a range of frequencies, and means including a resistor coupled with said collector electrode and a capacitor having reactance substantially equal to the resistance of said emitter electrode connected between said emitter electrode and a point of reference potential in said circuit providing amplitude stabilization of said device over the range of oscillator frequencies.

6. An oscillator for generating oscillations of substantially constant amplitude over a range of oscillator frequencies comprising in combination, a semi-conductor device having a semi-conductive body and an emitter, a base and a collector electrode each in contact with said body; means including a source of biasing potentials for biasing said electrodes; feedback means including a first inductor in series with said collector electrode, a second inductor in series with said base electrode, and a tunable parallel resonant circuit inductively coupled with said first and second inductors; a biasing resistor connected in series with said emitter electrode; an impedance element connected in series with said first inductor; and a reactive element connected from a point between said emitter electrode and said biasing resistor to a point of reference potential; said impedance and reactive elements providing amplitude stabilization for said oscillator over the range of oscillator frequencies.

7. An oscillator generator comprising in combination, a semi-conductor device having a semi-conductive body and an emitter, a base and a collector electrode each in contact with said body; means including a source of biasing potentials for biasing said electrodes for operation in said generator; feedback means including a first inductor in circuit with said collector electrode, a second inductor in circuit with said base electrode, and a tunable frequency determining circuit inductively coupled with said first and second inductors; means providing amplitude stabilization for said oscillator generator including a resistor connected in circuit with said collector electrode; and a capacitor connected in circuit with said emitter electrode.

8. An oscillator for generating oscillations of substantially constant amplitude over a range of oscillator frequencies comprising in combination, a semi-conductor device having a semi-conductive body and an emitter, a base and a collector electrode each in contact with said body; energizing means coupled to each of said electrodes for applying a bias in a reverse direction between said collector and base electrodes and a bias in a forward direction between said emitter and base electrodes; feedback means including a first inductor in circuit with said collector electrode, a second inductor in circuit with said base electrode, and a parallel-resonant frequency determining circuit including a third inductor, said third inductor being inductively coupled with said first and second inductors; an impedance element connected in circuit with said collector electrode; and a reactive element connected in circuit with said emitter electrode; said impedance and reactive elements providing amplitude stabilization for said oscillator over the range of oscillator frequencies.

9. An oscillator in accordance with claim 8, wherein the turns ratio of said first, second, and third inductors is in the order of 2:1:10 respectively.

10. An oscillator comprising in combination, a semi-conductor device having a semi-conductive body and an emitter, a base and a collector electrode each in contact with said body; energizing means coupled to each of said electrodes for applying a bias in a reverse direction between said collector and base electrodes and a bias in a forward direction between said emitter and base electrodes; feedback means including a first and second regenerative feedback path, said first path including a first inductor connected in series with said collector electrode and a second inductor inductively coupled with said first inductor and connected serially with said base electrodes, said second path comprising a parallel resonant frequency determining circuit including a third inductor inductively coupled with said first and second inductors; a resistor connected in series with said first inductor; a first capacitor connected between said emitter electrode and a point of fixed reference potential; said resistor and first capacitor providing amplitude stabilization for said oscillator over its range of tunable frequencies; and an output circuit including a pair of series capacitors providing a voltage dividing network connected in shunt with said second inductor.

11. A frequency converter comprising a semi-conductor device having a semi-conductive body, a base electrode, an emitter electrode and a collector electrode each in contact with said body, means including a source of biasing potentials for biasing said electrodes, a source of modulated carrier waves coupled to said emitter electrode for impressing said carrier waves thereon and including means for selecting a carrier wave having a predetermined frequency, a first resonant circuit tuned to a frequency different from said predetermined frequency for developing oscillatory waves, a first inductor coupled with said collector electrode, a second inductor coupled with said base electrode, said resonant circuit and first and second inductors providing regenerative feedback for said device, a second resonant circuit coupled with said collector electrode and tuned to a predetermined intermediate frequency obtained by beating said carrier waves with said oscillatory waves, and means for stabilizing the amplitude of said oscillatory waves, said means including an impedance element connected in series between said collector electrode and said second resonant circuit and a reactive element connected between said emitter electrode and a point of fixed reference potential.

12. An oscillator circuit for providing substantially constant amplitude oscillations over a range of frequencies comprising, in combination, a transistor including base, emitter, and collector electrodes, means providing regenerative signal coupling between said collector and base electrodes to provide feedback of signal current from said collector electrode to said base electrode of proper phase to sustain continuous oscillation of said oscillator circuit over said range of frequencies, means providing a source of direct current operating potential for biasing said transistor for amplifying operation, means providing resistance connected with said collector electrode of a magnitude to vary the collector electrode potential of said transistor with variations in the amplitude of said oscillations, and a capacitor connected with said emitter electrode for decreasing the emitter electrode impedance of said transistor with increases in frequency for providing in combination with said collector electrode resistance substantially constant amplitude operation of said oscillator circuit.

13. An oscillator circuit for providing substantially constant amplitude oscillations over a range of frequencies comprising, in combination, a transistor including base, emitter, and collector electrodes, means providing regenerative signal coupling between said collector and base electrodes to provide feedback of signal current from said collector electrode to said base electrode of proper phase to sustain continuous oscillation of said oscillator circuit over said range of frequencies, means providing a source of direct current operating potential for biasing said transistor for amplifying operation, and a capacitor connected directly with said emitter electrode for decreasing the emitter electrode impedance of said transistor with increases in frequency to increase the amplitude of said oscillations with increases in frequency for providing substantially constant amplitude operation of said oscillator circuit, said capacitor having reactance substantially equal to the emitter electrode resistance of said transistor.

(References on following page)

References Cited in the file of this patent

UNITED STATES PATENTS

| | | |
|---|---|---|
| 1,340,193 | Vreeland | May 18, 1920 |
| 1,886,571 | Miller | Nov. 8, 1932 |
| 1,890,426 | Macnabb | Dec. 6, 1932 |
| 1,997,393 | Roberts | Apr. 9, 1935 |
| 2,245,718 | Roberts | June 17, 1941 |
| 2,266,670 | Winfield | Dec. 16, 1941 |
| 2,523,051 | Norgaard | Sept. 19, 1950 |
| 2,620,448 | Wallace | Dec. 2, 1952 |
| 2,647,957 | Mallinckrodt | Aug. 4, 1953 |

OTHER REFERENCES

Article: "Transistor Circuit Design," by Raisbeck; pages 128–132, and 134 of December 1951 issue of Electronics.

Article: "Transisforizing Communication Equipment" by Epstein et al., pages 96–102, 144 of Electronics, vol. 25, No. 5, for May 1952.